United States Patent
Hu et al.

(10) Patent No.: US 10,703,905 B2
(45) Date of Patent: Jul. 7, 2020

(54) RESIN COMPOSITION AND ARTICLE MADE THEREFROM

(71) Applicant: Elite Electronic Material (Zhongshan) Co., Ltd., Zhongshan, Guang Dong Prov. (CN)

(72) Inventors: Zhilong Hu, Zhongshan (CN); Licheng Lin, Zhongshan (CN)

(73) Assignee: ELITE ELECTRONIC MATERIAL (ZHONGSHAN) CO., LTD., Zhongshan, Guang Dong Province (CN)

( * ) Notice: Subject to any disclaimer, the term of this patent is extended or adjusted under 35 U.S.C. 154(b) by 228 days.

(21) Appl. No.: 15/699,347

(22) Filed: Sep. 8, 2017

(65) Prior Publication Data
US 2018/0371243 A1 Dec. 27, 2018

(30) Foreign Application Priority Data
Jun. 26, 2017 (CN) .......................... 2017 1 0494203

(51) Int. Cl.
| | |
|---|---|
| *C08L 79/04* | (2006.01) |
| *B32B 5/02* | (2006.01) |
| *B32B 15/14* | (2006.01) |
| *B32B 15/08* | (2006.01) |
| *B32B 15/20* | (2006.01) |
| *C08J 5/18* | (2006.01) |
| *C08J 5/24* | (2006.01) |
| *H05K 1/03* | (2006.01) |
| *H05K 1/09* | (2006.01) |

(52) U.S. Cl.
CPC ................ *C08L 79/04* (2013.01); *B32B 5/02* (2013.01); *B32B 15/08* (2013.01); *B32B 15/14* (2013.01); *B32B 15/20* (2013.01); *C08J 5/18* (2013.01); *C08J 5/24* (2013.01); *H05K 1/0353* (2013.01); *H05K 1/09* (2013.01); *B32B 2260/046* (2013.01); *B32B 2307/3065* (2013.01); *B32B 2457/08* (2013.01); *C08J 2379/04* (2013.01); *C08J 2463/00* (2013.01); *C08J 2463/04* (2013.01); *C08J 2479/04* (2013.01); *C08L 2203/16* (2013.01); *C08L 2203/20* (2013.01); *C08L 2205/025* (2013.01); *C08L 2205/035* (2013.01); *H05K 1/0373* (2013.01); *H05K 2201/012* (2013.01); *H05K 2201/0209* (2013.01)

(58) Field of Classification Search
CPC ..... B32B 15/08; B32B 15/20; B32B 2457/08; C08L 79/04
See application file for complete search history.

(56) References Cited

U.S. PATENT DOCUMENTS 6,620,905 B1 * 9/2003 Musa .................. C07D 265/16
525/203

FOREIGN PATENT DOCUMENTS

JP 2016196548 A * 11/2016

* cited by examiner

*Primary Examiner* — Gerard Higgins
(74) *Attorney, Agent, or Firm* — Muncy, Geissler, Olds & Lowe, P.C.

(57) ABSTRACT

Disclosed is a resin composition, which comprises 30 parts by weight to 90 parts by weight of a maleimide resin and 15 parts by weight to 60 parts by weight of a benzoxazine resin. The resin composition may be fabricated into various articles, such as prepregs, prepregs with copper foil, resin films, resin films with copper foil, laminates or printed circuit boards, which possess at least one, more or all of the following properties: high peel strength, high thermal resistance after moisture absorption, high glass transition temperature, low thermal expansion, high thermal resistance, low dielectric constant, low dissipation factor and so on.

15 Claims, No Drawings

RESIN COMPOSITION AND ARTICLE MADE THEREFROM

CROSS-REFERENCE TO RELATED APPLICATION

This application claims the priority benefit of China Patent Application No. 201710494203.4, filed on Jun. 26, 2017, the entirety of which is hereby incorporated by reference and made a part of this specification.

BACKGROUND

1. Field of the Disclosure

The present disclosure relates to a resin composition and more particularly to a resin composition useful for preparing a prepreg, a prepreg with copper foil, a resin film, a resin film with copper foil, a laminate or a printed circuit board with improved properties.

2. Description of Related Art

Conductive anodic filament (CAF) is a problem frequently faced by printed circuit boards, particularly by high layer count boards, which need to avoid or inhibit CAF to ensure long-term use reliability.

High humidity operation environment is one major cause of CAF, and therefore the capability of the laminate to tolerate heat after long-term moisture absorption in a high temperature and high humidity environment, e.g., thermal resistance after 168 hours of high temperature and high humidity, and the bonding strength between the insulation layer and the copper foil are important. In addition, during the fabrication of a printed circuit board, several times of trace brown oxide or black oxide treatment and washing process are performed; therefore, if the material has high moisture absorption property or reduced thermal resistance after moisture absorption, the yield of the process will be largely reduced. Accordingly, materials with low long-term moisture absorption and high thermal resistance after moisture absorption are considered as excellent materials for printed circuit boards.

On the other hand, recently, due to the demands for high speed signal transmission, miniaturization, and light weight of electronic devices, printed circuit boards were continuously developed to realize multiple layers, high density interconnection, fine line (i.e., narrow trace) and narrow spacing.

The fabrication of printed circuit board traces usually involves etching of copper foils. During the formation of circuits with fine lines, if an ordinary copper foil, such as a copper foil with a thickness between 18 μm and 35 μm, is used, certain conditional limits in the etching processes fail to fully satisfy the demands for fine line and narrow spacing. In this regard, using an ultra-thin copper foil is advantageous for reducing the amount of copper etched and ensuring satisfactory trace shape and trace width, thereby enhancing the capability of forming fine lines.

While there is a long-standing need for using ultra-thin copper foils in the industry, many problems are encountered by the current fabrication processes. For example, ultra-thin copper foils are prone to roughness change during the processes and may cause weakened adhesiveness, which results in poor adhesion between the ultra-thin copper foils and insulation resin layers and accompanying problems like circuit peeling off. Moreover, since reflow and other thermal treatments are used in the processes, the adhesion between the ultra-thin copper foils and insulation resin layers is significantly reduced after reflow. Therefore, there is a need for improving the peel strength between ultra-thin copper foils and insulation materials while at the same time maintaining thermal resistance and various physical and chemical properties so as to achieve overall excellent properties.

SUMMARY

To address the aforesaid and other issues, particularly issues of conventional materials which fail to satisfy thermal resistance after moisture absorption at high temperature and high peel strength for ultra-thin copper foils, the present disclosure provides a resin composition, comprising 30 parts by weight to 90 parts by weight of a maleimide resin and 15 parts by weight to 60 parts by weight of a benzoxazine resin, wherein the benzoxazine resin comprises an oxydianiline benzoxazine resin and an unsaturated bond-containing benzoxazine resin, and a weight ratio of the oxydianiline benzoxazine resin to the unsaturated bond-containing benzoxazine resin is between 1:2 and 9:1, such as 1:2, 1:1, 2:1, 3:1, 4:1, 5:1, 6:1, 7:1, 8:1 or 9:1.

In one embodiment, the content of maleimide resin may be 40 parts by weight to 80 parts by weight; in one embodiment, the content of benzoxazine resin may be 15 parts by weight to 50 parts by weight, such as 15 parts by weight to 40 parts by weight.

In one embodiment, the resin composition further comprises epoxy resin.

In one embodiment, the content of maleimide resin is greater than or equal to the content of epoxy resin.

For example, the resin composition may comprise 30 parts by weight to 90 parts by weight of the maleimide resin and 10 parts by weight to 65 parts by weight of the epoxy resin, such as 10 parts by weight to 50 parts by weight of the epoxy resin.

In one embodiment, the unsaturated bond-containing benzoxazine resin has the following structure of formula (I):

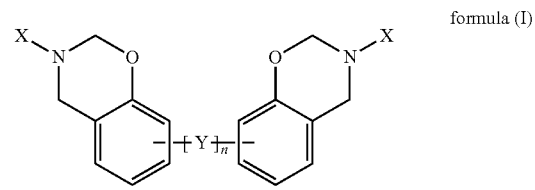

formula (I)

wherein X is an unsaturated bond-containing group, Y is a divalent group, and n is an integer of 1 to 10.

In one embodiment, the present disclosure provides a resin composition, comprising 10 parts by weight to 65 parts by weight of epoxy resin, 30 parts by weight to 90 parts by weight of a maleimide resin and 15 parts by weight to 60 parts by weight of a benzoxazine resin, wherein the benzoxazine resin comprises an oxydianiline benzoxazine resin and an unsaturated bond-containing benzoxazine resin, a weight ratio of the oxydianiline benzoxazine resin to the unsaturated bond-containing benzoxazine resin is between 1:2 and 9:1, and a weight ratio of the maleimide resin to the epoxy resin is between 5:1 and 1:1.

In another aspect, the present disclosure provides an article made from the resin composition, which may be a prepreg, a prepreg with copper foil, a resin film, a resin film with copper foil, a laminate or a printed circuit board.

In one embodiment, the article comprising a copper foil and an insulation layer has a peel strength as measured by reference to IPC-TM-650 2.4.8 of between 4.0 lb/in and 9.0 lb/in.

In one embodiment, the article comprising an ultra-thin copper foil (thickness of between 1 μm and 6 μm) and an insulation layer has a peel strength as measured by reference to IPC-TM-650 2.4.8 of between 4.5 lb/in and 6.5 lb/in.

In one embodiment, interlayer delamination is prevented after subjecting the article to PCT test by reference to IPC-TM-650 2.6.16.1 for 168 hours.

In one embodiment, the article has at least one of the following properties: a glass transition temperature as measured by reference to IPC-TM-650 2.4.24.4 of greater than or equal to 265° C., such as between 265° C. and 335° C. or between 300° C. and 330° C.; a z-axis ratio of thermal expansion measured with a TMA instrument by reference to IPC-TM-650 2.4.24.5 of less than or equal to 1.70%, such as less than or equal to 1.60%, 1.50%, 1.30%, or 1.25%, less than or equal to 1.20% or less than or equal to 1.10%, preferably less than or equal to 1.30%, 1.25%, 1.20% or 1.10%; a T288 thermal resistance as measured by reference to IPC-TM-650 2.4.24.1 of greater than or equal to 10 minutes, such as greater than or equal to 20 minutes, 50 minutes, 55 minutes, 60 minutes, 120 minutes, 180 minutes, 240 minutes or 300 minutes, preferably greater than or equal to 50 minutes, 55 minutes, 60 minutes, 120 minutes, 180 minutes, 240 minutes or 300 minutes; and a flame retardancy of UL94 rating V0 or V1, such as V0.

In one embodiment, the article has at least one of the following properties: a dielectric constant at 2 GHz as measured by reference to JIS C2565 of less than or equal to 3.90, such as less than or equal to 3.85, 3.82, 3.80 or 3.75; and a dissipation factor at 2 GHz as measured by reference to JIS C2565 of less than or equal to 0.0085, 0.0080, 0.0075, 0.0072, 0.0070, 0.0065 or 0.0060, preferably less than or equal to 0.0072, 0.0070, 0.0065 or 0.0060.

Optionally, in addition to the ingredients above, the resin composition may further comprise one or more of the following additives: polyphenylene oxide resin, cyanate ester resin, isocyanate resin, polyolefin resin, anhydride (e.g., styrene maleic anhydride), polyester, phenolic curing agent, amine curing agent, polyamide and polyimide.

Optionally, in addition to the ingredients above, the resin composition may further comprise curing accelerator, flame retardant, inorganic filler, solvent, toughening agent, silane coupling agent or a combination thereof.

As used herein, various IPC test standards refer to the test processes or manuals published by the Association Connecting Electronics Industries, which are available from the link http://www.ipc.org.cn/Test-Methods.asp. As used herein, the JIS test standards refer to the test processes or manuals published by the Japanese Industrial Standards Committee, which are available from the link http://www.jisc.go.jp/app/JPS/JPSO0020.html.

DETAILED DESCRIPTION OF EMBODIMENTS

To enable those skilled in the art to further appreciate the features and effects of the present disclosure, words and terms contained in the specification and appended claims are described and defined. Unless otherwise defined, all technical and scientific terms used herein have the same meaning as commonly understood by those of ordinary skill in the art to which this disclosure pertains. In the case of conflict, the present document and definitions contained herein will control.

As used herein, "a," "an" or similar expression is employed to describe elements and features of the present disclosure. This is done merely for convenience and to give a general sense of the scope of the present disclosure. Accordingly, this description should be read to include one or at least one and the singular also includes the plural unless it is obvious to mean otherwise.

As used herein, the term "comprises," "comprising," "includes," "including," "has," "having" or any other variant thereof is construed as an open-ended transitional phrase intended to cover a non-exclusive inclusion. For example, a composition or manufacture that comprises a list of elements is not necessarily limited to only those elements but may include other elements not expressly listed or inherent to such composition or manufacture. Further, unless expressly stated to the contrary, the term "or" refers to an inclusive or and not to an exclusive or. For example, a condition "A or B" is satisfied by any one of the following: A is true (or present) and B is false (or not present), A is false (or not present) and B is true (or present), and both A and B are true (or present). In addition, whenever open-ended transitional phrases are used, such as "comprises," "comprising," "includes," "including," "has," "having" or any other variant thereof, it is understood that transitional phrases such as "consisting essentially of" and "consisting of" are also disclosed and included.

In this disclosure, features or conditions presented as a numerical range or a percentage range are merely for convenience and brevity. Therefore, a numerical range or a percentage range should be interpreted as encompassing and specifically disclosing all possible subranges and individual numerals or values therein, particularly all integers therein. For example, a range of "1 to 8" or "between 1 and 8" should be understood as explicitly disclosing all subranges such as 1 to 7, 2 to 8, 2 to 6, 3 to 6, 4 to 8, 3 to 8 and so on, particularly all subranges defined by integers, as well as disclosing all individual values such as 1, 2, 3, 4, 5, 6, 7 and 8. Unless otherwise defined, the aforesaid interpretation rule should be applied throughout the present disclosure regardless broadness of the scope.

Whenever amount, concentration or other numeral or parameter is expressed as a range, a preferred range or a series of upper and lower limits, it is understood that all ranges defined by any pair of the upper limit or preferred value and the lower limit or preferred value are specifically disclosed, regardless whether these ranges are explicitly described or not. In addition, unless otherwise defined, whenever a range is mentioned, the range should be interpreted as inclusive of the endpoints and every integers and fractions in the range.

Given the intended purposes and advantages of this disclosure are achieved, numerals or figures have the precision of their significant digits. For example, 40.0 should be understood as covering a range of 39.50 to 40.49.

As used herein, a Markush group or a list of items is used to describe examples or embodiments of the present disclosure. A skilled artisan will appreciate that all subgroups of members or items and individual members or items of the Markush group or list can also be used to describe the present disclosure. For example, when X is described as being "selected from a group consisting of $X_1$, $X_2$ and $X_3$," it is intended to disclose the situations of X is $X_1$ and X is $X_1$ and/or $X_2$. In addition, when a Markush group or a list of items is used to describe examples or embodiments of the present disclosure, a skilled artisan will understand that any subgroup or any combination of the members or items in the Markush group or list may also be used to describe the present disclosure. Therefore, when X is described as being "selected from a group consisting of $X_1$, $X_2$ and $X_3$," and Y is described as being "selected from a group consisting of $Y_1$, $Y_2$ and $Y_3$," the disclosure of any combination of X is $X_1$ and/or $X_2$ and/or $X_3$ and Y is $Y_1$ and/or $Y_2$ and/or $Y_3$.

The following embodiments and examples are illustrative in nature and are not intended to limit the present disclosure and its application. In addition, the present disclosure is not bound by any theory described in the background and summary above or the following embodiments or examples.

Resin Composition

In the present disclosure, the resin composition primarily comprises 30 parts by weight to 90 parts by weight of a maleimide resin and 15 parts by weight to 60 parts by weight of a benzoxazine resin, wherein the benzoxazine resin comprises an oxydianiline benzoxazine resin and an unsaturated bond-containing benzoxazine resin, and a weight ratio of the oxydianiline benzoxazine resin to the unsaturated bond-containing benzoxazine resin is between 1:2 and 9:1, such as 1:2, 1:1, 2:1, 3:1, 4:1, 5:1, 6:1, 7:1, 8:1 or 9:1.

In the resin composition, the maleimide resin refers to a compound, monomer, mixture, oligomer or polymer containing at least one maleimide group. Unless otherwise specified, the maleimide resin used in the present disclosure is not particularly limited and may include any one or more maleimide resins useful for preparing a prepreg, a prepreg with copper foil, a resin film, a resin film with copper foil, a laminate or a printed circuit board. Examples include but are not limited to 4,4'-diphenylmethane bismaleimide, oligomer of phenylmethane maleimide (a.k.a. polyphenylmethane maleimide), m-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, 1,6-bismaleimide-(2,2,4-trimethyl hexane), N-2,3-xylylmaleimide, N-2,6-xylenemaleimide, N-phenylmaleimide, maleimide compound containing aliphatic long chain structure, prepolymer thereof and a combination thereof. The aforesaid prepolymer may for example be a prepolymer of diallyl compound and maleimide compound, a prepolymer of diamine and maleimide compound, a prepolymer of multi-functional amine and maleimide compound or a prepolymer of acid phenol compound and maleimide compound.

For example, the maleimide resin may include products such as BMI-70, BMI-80, BMI-1000, BMI-1000H, BMI-1100, BMI-1100H, BMI-2000, BMI-2300, BMI-3000, BMI-3000H, BMI-4000H, BMI-5000, BMI-5100, BMI-7000 and BMI-7000H sold by Daiwa Kasci Co., Ltd.

For example, the maleimide resin containing aliphatic long chain structure may include products such as BMI-689, BMI-1400, BMI-1500, BMI-1700, BMI-2500, BMI-3000, BMI-5000 and BMI-6000 sold by Designer Molecules Inc.

In one embodiment, the content of maleimide is preferably 40 to 80 parts by weight.

In the resin composition, the oxydianiline benzoxazine resin may serve as a curing agent and have for example the structure of formula (II):

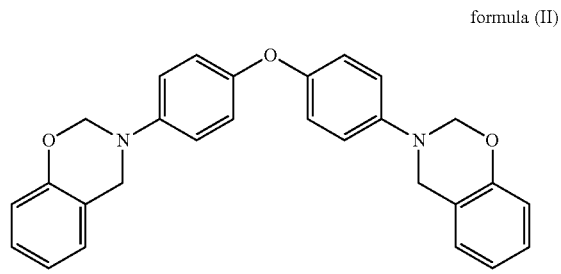 [SMILES: c1ccc2c(c1)CN(c1ccc(Oc3ccc(N4COc5ccccc5C4)cc3)cc1)CO2]

formula (II)

In one embodiment, the oxydianiline benzoxazine resin may be for example PF-3500 sold by Chang Chun Plastics.

In the resin composition, the unsaturated bond-containing benzoxazine resin may have for example the structure of formula (I):

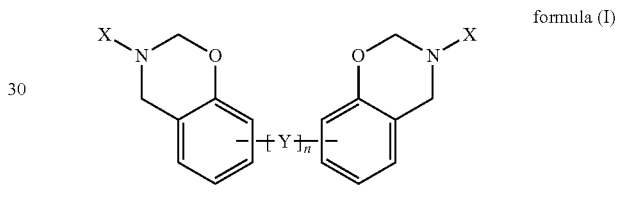

formula (I)

wherein X is an unsaturated bond-containing (e.g., double bond or triple bond) group, preferably a group forming a hydrophobic alkyl chain after curing, more preferably vinyl group, allyl group, styryl group or acrylate group;

n is an integer of 1 to 10, preferably an integer of 1 to 3;

Y is a divalent group, preferably alkylene, cycloalkylene, arylene or —$SO_2$—; wherein the alkylene is preferably —$C(CH_3)_2$—, —$CH(CH_3)$—, —$CH_2$— and substituted or unsubstituted dicyclopentadienyl; and wherein arylene is preferably substituted or unsubstituted phenylene, biphenyl, naphthalene, phenol novolac, bisphenol A, bisphenol A novolac, bisphenol F and bisphenol F novolac group. In addition, Y is more preferably a divalent group with high free volume and low dielectric property.

In one embodiment, the unsaturated bond-containing benzoxazine resin may be any one or a combination of formula (III) to formula (VIII) below:

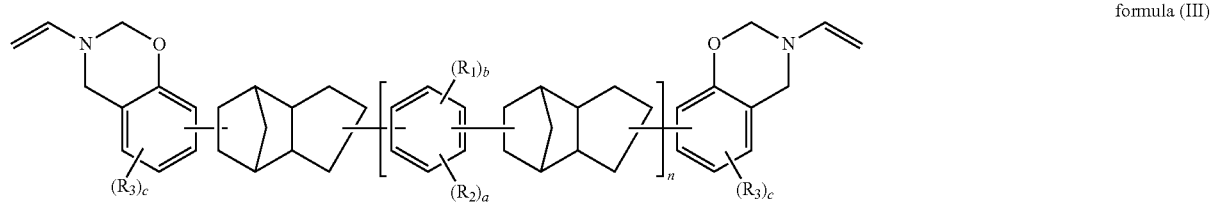

formula (III)

-continued

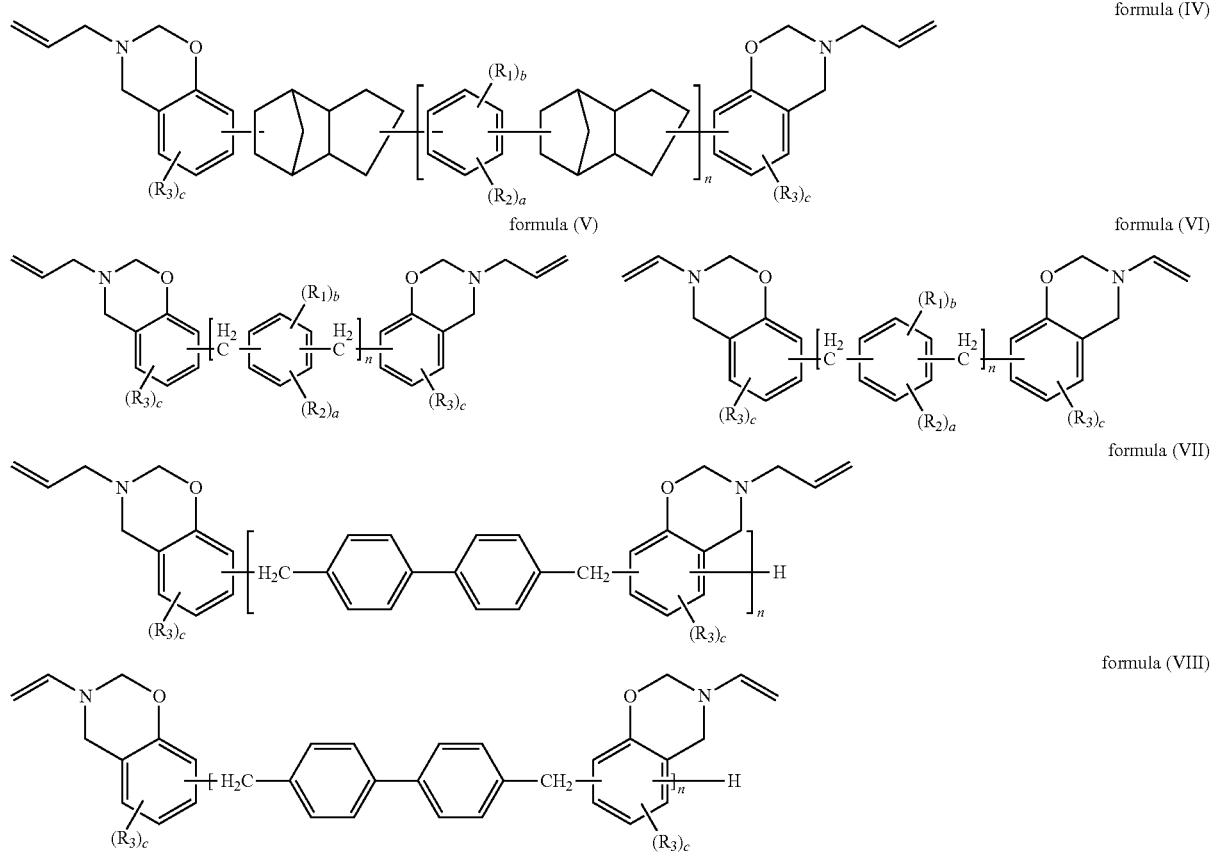

formula (IV)

formula (V)

formula (VI)

formula (VII)

formula (VIII)

wherein a and b independently represent an integer of 0 to 4 and a+b≤4; c represents an integer of 0 to 2;

$R_1$ and $R_2$ independently represent hydrogen, oxygen-containing group, substituted or unsubstituted alkyl, or $R_1$ and $R_2$ together form an N-heterocycle or O-heterocycle; preferably, $R_1$ and $R_2$ independently represent hydrogen, hydroxyl or methyl;

$R_3$ represents hydrogen or substituted or unsubstituted alkyl, preferably hydrogen or methyl;

n is an integer of 1 to 10, preferably an integer of 1 to 3.

Preferably, the unsaturated bond-containing benzoxazine resin may be any one or a combination of formula (IX) to formula (XXII), wherein n is an integer of 1 to 10 and preferably 1 to 3.

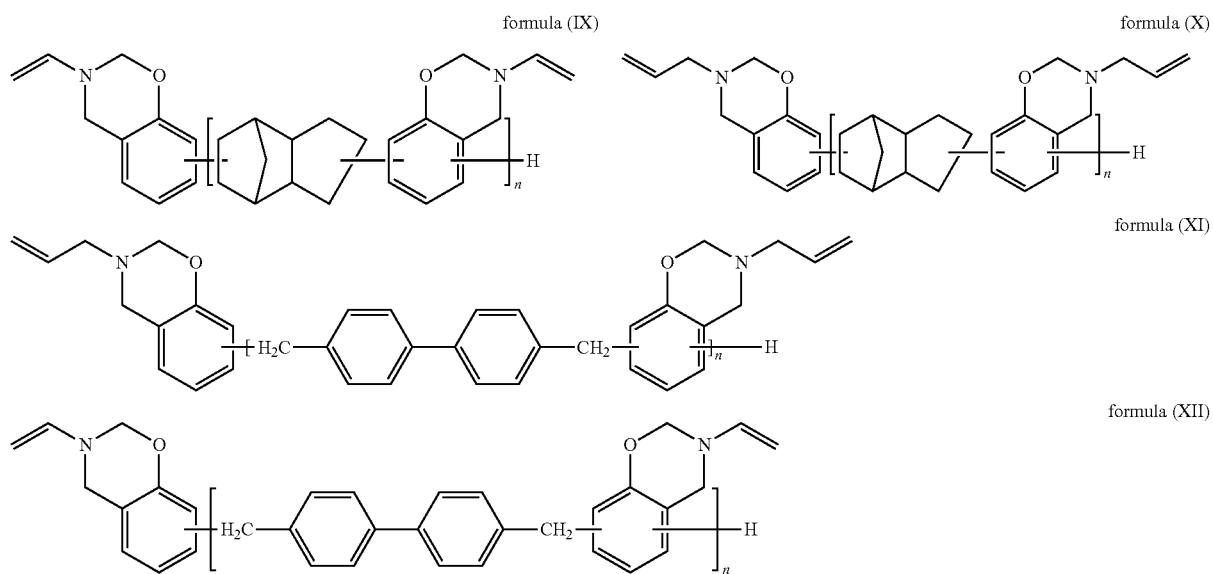

formula (IX)

formula (X)

formula (XI)

formula (XII)

-continued formula (XIII)
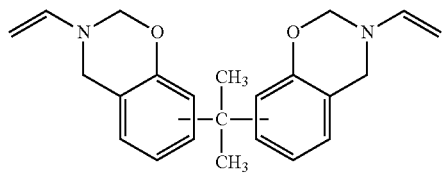

formula (XIV)
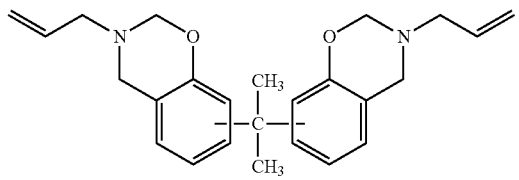

formula (XV)
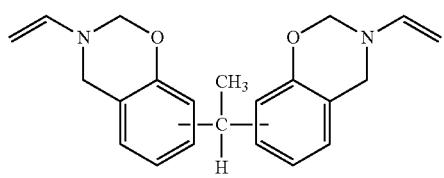

formula (XVI)

formula (XVII)
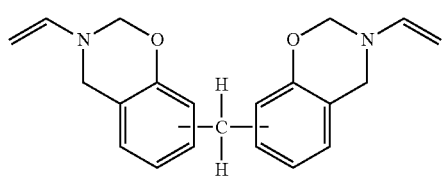

formula (XVIII)

formula (XIX)
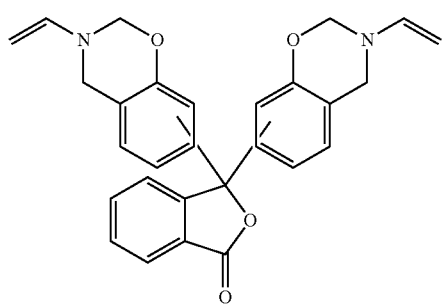

formula (XX)
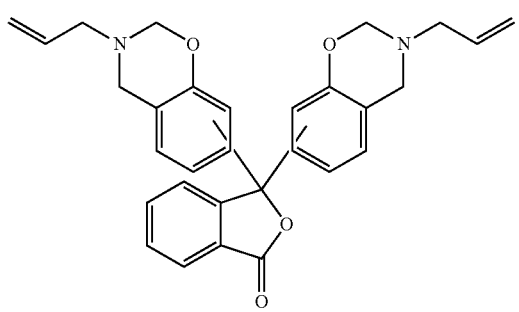

formula (XXI)
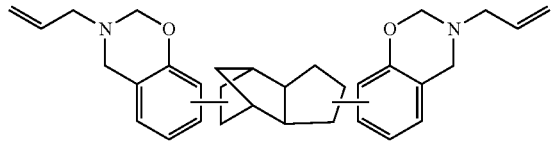

formula (XXII)
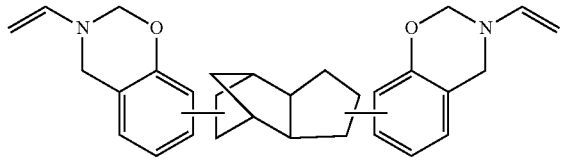

In the resin composition, the unsaturated bond-containing benzoxazine resin may be allyl-modified benzoxazine resin, which may be any one or a mixture of allyl-modified bisphenol A benzoxazine resin, allyl-modified bisphenol F benzoxazine resin, allyl-modified dicyclopentadiene phenol benzoxazine resin and allyl-modified bisphenol S benzoxazine resin. The mixture may be for example a mixture of allyl-modified bisphenol A benzoxazine resin and allyl-modified bisphenol F benzoxazine resin; a mixture of allyl-modified dicyclopentadiene phenol benzoxazine resin and allyl-modified bisphenol S benzoxazine resin; a mixture of allyl-modified dicyclopentadiene phenol benzoxazine resin and allyl-modified bisphenol F benzoxazine resin; or a mixture of allyl-modified dicyclopentadiene phenol benzoxazine resin and allyl-modified bisphenol A benzoxazine resin.

In addition to the oxydianiline benzoxazine resin and the unsaturated bond-containing benzoxazine resin, the resin composition of the present disclosure may further comprise optional different benzoxazine resins, including but not limited to any one or more of the following: bisphenol A benzoxazine resin, bisphenol F benzoxazine resin, diamino benzoxazine resin, dicyclopentadiene benzoxazine resin, phenolphthalein benzoxazine resin and phosphorus-containing benzoxazine resin. The diamino benzoxazine resin may be diaminodiphenylmethane benzoxazine resin, diaminodiphenyl sulfone benzoxazine resin, diaminodiphenyl sulfide benzoxazine resin or a combination thereof.

In addition to the major components described above, resin compositions of different embodiments according to the present disclosure may further optionally comprise epoxy resin.

In one embodiment, the content of maleimide resin is greater than or equal to the content of epoxy resin. For example, the weight ratio of maleimide resin to epoxy resin may be between 5:1 and 1:1.

In one embodiment, the resin composition comprises 30 parts by weight to 90 parts by weight of the maleimide resin and 10 parts by weight to 65 parts by weight of the epoxy resin, preferably 10 parts by weight to 50 parts by weight of the epoxy resin.

In one embodiment, the present disclosure provides a resin composition, comprising 10 parts by weight to 65 parts by weight of epoxy resin, 30 parts by weight to 90 parts by weight of a maleimide resin and 15 parts by weight to 60 parts by weight of a benzoxazine resin, wherein the benzoxazine resin comprises an oxydianiline benzoxazine resin and an unsaturated bond-containing benzoxazine resin, a weight ratio of the oxydianiline benzoxazine resin to the unsaturated bond-containing benzoxazine resin is between 1:2 and 9:1, and a weight ratio of the maleimide resin to the epoxy resin is between 5:1 and 1:1.

In various embodiments of the present disclosure, the epoxy resin is not particularly limited and may include any one or more epoxy resins useful for preparing a prepreg, a prepreg with copper foil, a resin film, a resin film with copper foil, a laminate or a printed circuit board; examples include bisphenol A epoxy resin, bisphenol F epoxy resin, bisphenol S epoxy resin, bisphenol AD epoxy resin, phenol novolac epoxy resin, trifunctional epoxy resin, tetrafunctional epoxy resin, multifunctional epoxy resin, dicyclopentadiene (DCPD) epoxy resin, phosphorus-containing epoxy resin, p-xylene epoxy resin, naphthalene epoxy resin (e.g., naphthol epoxy resin), benzofuran epoxy resin, isocyanate-modified epoxy resin or a combination thereof. The phenol novolac epoxy resin may be bisphenol A novolac epoxy resin, bisphenol F novolac epoxy resin, biphenyl novolac epoxy resin, phenol benzaldehyde epoxy resin, triphenylmethyl epoxy resin, phenol aralkyl novolac epoxy resin or o-cresol novolac epoxy resin, wherein the phosphorus-containing epoxy resin may be DOPO (9,10-dihydro-9-oxa-10-phosphaphenanthrene-10-oxide) epoxy resin, DOPO-HQ epoxy resin or a combination thereof. The DOPO epoxy resin may be any one or more selected from DOPO-containing phenolic novolac epoxy resin, DOPO-containing cresol novolac epoxy resin and DOPO-containing bisphenol-A novolac epoxy resin; the DOPO-HQ epoxy resin may be any one or more selected from DOPO-HQ-containing phenolic novolac epoxy resin, DOPO-HQ-containing cresol novolac epoxy resin and DOPO-HQ-containing bisphenol-A novolac epoxy resin.

In addition, the resin composition of the present disclosure may further comprise optionally one or more of the following additives: polyphenylene oxide resin, cyanate ester resin, isocyanate resin, polyolefin resin, anhydride (e.g., styrene maleic anhydride), polyester, phenolic curing agent, amine curing agent, polyamide and polyimide.

Unless otherwise specified, relative to 100 parts by weight of the maleimide resin and the benzoxazine resin, the polyphenylene oxide resin used in the present disclosure is not particularly limited, and may be used at an amount of 1 to 100 parts by weight. The polyphenylene oxide resin is not particularly limited and may include any one or more polyphenylene oxide resins useful for preparing a prepreg, a prepreg with copper foil, a resin film, a resin film with copper foil, a laminate or a printed circuit board; examples include dihydroxyl-terminated polyphenylene oxide resin (e.g., SA-90 available from SABIC), vinylbenzyl-terminated polyphenylene oxide resin (e.g., OPE-2st available from Mitsubishi Gas Chemical Co., Inc.), vinyl-benzylated modified bisphenol A polyphenylene oxide and methacrylate-terminated polyphenylene oxide resin (e.g., SA-9000 available from SABIC).

Unless otherwise specified, relative to 100 parts by weight of the maleimide resin and the benzoxazine resin, the cyanate ester resin used in the present disclosure is not particularly limited, and may be used at an amount of 1 to 100 parts by weight. The cyanate ester resin may include any one or more cyanate ester resins useful for preparing a prepreg, a prepreg with copper foil, a resin film, a resin film with copper foil, a laminate or a printed circuit board, such as a compound having an Ar—O—C≡N structure, wherein Ar may be a substituted or unsubstituted aromatic group. Examples include but are not limited to novolac cyanate ester resin, bisphenol A cyanate ester resin, bisphenol F cyanate ester resin, dicyclopentadiene-containing cyanate ester resin, naphthalene-containing cyanate ester resin, phenolphthalein cyanate ester resin, adamantane cyanate ester resin or fluorene cyanate ester resin. The novolac cyanate ester resin may be bisphenol A novolac cyanate ester resin, bisphenol F novolac cyanate ester resin or a combination thereof. For example, the cyanate ester resin may be available under the tradename Primaset PT-15, PT-30S, PT-60S, CT-90, BADCY, BA-100-10T, BA-200, BA-230S, BA-300S, BTP-2500, BTP-6020S, DT-4000, DT-7000, Methylcy, and ME-240S sold by Lonza.

Unless otherwise specified, relative to 100 parts by weight of the maleimide resin and the benzoxazine resin, the isocyanate resin used in the present disclosure is not particularly limited, and may be used at an amount of 1 to 100 parts by weight. The isocyanate resin may include any one or more isocyanate resins useful for preparing a prepreg, a prepreg with copper foil, a resin film, a resin film with copper foil, a laminate or a printed circuit board. Examples include but are not limited to 1,4-cyclohexane diisocyanate, isophorone diisocyanate, methylene bis(4-cyclohexylisocyanate), triallyl isocyanurate (TAIC), hydrogenated 1,3-xylylene diisocyanate and hydrogenated 1,4-xylylene diisocyanate.

Unless otherwise specified, relative to 100 parts by weight of the maleimide resin and the benzoxazine resin, the polyolefin resin used in the present disclosure is not particularly limited, and may be used at an amount of 1 to 100 parts by weight. The polyolefin resin may include any one or more polyolefin resins useful for preparing a prepreg, a prepreg with copper foil, a resin film, a resin film with copper foil, a laminate or a printed circuit board. Examples include but are not limited to styrene-butadiene-divinylbenzene terpolymer, styrene-butadiene-maleic anhydride terpolymer, vinyl-polybutadiene-urethane oligomer, styrene butadiene copolymer, hydrogenated styrene butadiene copolymer, styrene isoprene copolymer, hydrogenated styrene isoprene copolymer, methylstyrene copolymer, petroleum resin, cycloolefin copolymer and a combination thereof.

Unless otherwise specified, relative to 100 parts by weight of the maleimide resin and the benzoxazine resin, the anhydride used in the present disclosure is not particularly limited, and may be used at an amount of 1 to 100 parts by weight. The anhydride may be a mono-functional, bifunctional or multifunctional anhydride. A mono-functional anhydride contains one cyclic anhydride group (—COOCO—) per molecule. Examples of dicarboxylic anhydride compound include maleic anhydride, phthalic anhydride, 4-methylhexahydrophthalic anhydride, hexahydrophthalic anhydride, methylbicyclo[2.2.1]heptane-2,3-dicarboxylic anhydride, bicyclo[2.2.1]heptane-2,3-dicarboxylic anhydride, and 1,2,3,6-tetrahydrophthalic anhydride. Examples may further include tricarboxylic anhydride compounds, such as trimellitic anhydride. In particular, in order to lower dielectric constant, preferred examples include 4-methylhexahydrophthalic anhydride, hexahydrophthalic anhydride, methylbicyclo[2.2.1]heptane-2,3-dicarboxylic anhydride, bicyclo[2.2.1]heptane-2,3-dicarboxylic anhydride, 1,2,3,6-tetrahydrophthalic anhydride and other alicyclic anhydrides.

Examples of bifunctional anhydride include pyromellitic dianhydride (PMDA), hydrogenated pyromellitic dianhydride (H-PMDA) and 5-(2,5-dioxotetrahydro-3-furyl)-3-methyl-3-cyclohexene-1,2-dicarboxylic anhydride (MCTC).

Examples of multifunctional anhydride include the binary copolymer SMA obtained by reacting styrene monomer with maleic anhydride so as to form the anhydride with multiple anhydride groups. Depending on the different arrangements of styrene monomer and maleic anhydride, SMA can be categorized as alternating copolymer, random copolymer, block copolymer, or graft copolymer. Any kind of the above copolymers may be used in the present disclosure. In the styrene maleic anhydride resin, the molar ratio of styrene to maleic anhydride may be 1:1, 2:1, 3:1, 4:1, 6:1, 8:1 or 12:1. Useful styrene maleic anhydride may be but not limited to styrene maleic anhydride copolymers such as SMA-1000, SMA-2000, SMA-3000, EF-30, EF-40, EF-60 and EF-80 sold by Cray Valley. Additionally, the styrene maleic anhydride resin may also be an esterified styrene maleic anhydride copolymer, such as esterified styrene maleic anhydride copolymers SMA1440, SMA17352, SMA2625, SMA3840 and SMA31890 sold by Cray Valley. The styrene maleic anhydride resin can be added individually or as a combination to the resin composition of this disclosure.

Unless otherwise specified, relative to 100 parts by weight of the maleimide resin and the benzoxazine resin, the polyester used in the present disclosure is not particularly limited, and may be used at an amount of 1 to 100 parts by weight. The polyester may include any one or more polyesters useful for preparing a prepreg, a prepreg with copper foil, a resin film, a resin film with copper foil, a laminate or a printed circuit board. Examples include but are not limited to HPC-8000T65 available from DIC Corporation.

Unless otherwise specified, relative to 100 parts by weight of the maleimide resin and the benzoxazine resin, the phenolic curing agent used in the present disclosure is not particularly limited, and may be used at an amount of 1 to 100 parts by weight. The phenolic curing agent may be a mono-functional, bifunctional or multifunctional phenolic curing agent and is not particularly limited, including those currently used in the field of the present disclosure. Examples include but are not limited to dicyclopentadiene phenol resin, biphenyl phenol resin, tetrafunctional phenol resin, phenol novolac resin or a combination thereof.

Unless otherwise specified, relative to 100 parts by weight of the maleimide resin and the benzoxazine resin, the amine curing agent used in the present disclosure is not particularly limited, and may be used at an amount of 0.001 to 10 parts by weight. The amine curing agent may include any one or more amine curing agents useful for preparing a prepreg, a prepreg with copper foil, a resin film, a resin-coated copper foil, a laminate or a printed circuit board. Examples include but are not limited to any one or a combination of diamino diphenyl sulfone, diamino diphenyl methane, diamino diphenyl ether, diamino diphenyl sulfide and dicyandiamide (DICY).

Optionally, in addition to the ingredients above, the resin composition of the present disclosure may further comprise additives such as curing accelerator, flame retardant, inorganic filler, solvent, toughening agent, silane coupling agent or a combination thereof.

Unless otherwise specified, relative to 100 parts by weight of the maleimide resin and the benzoxazine resin, the curing accelerator used in the present disclosure is not particularly limited, and may be used at an amount of 0.001 to 5 parts by weight. The curing accelerator may increase the curing rate of resin and may be any one or more curing accelerators useful for preparing a prepreg, a prepreg with copper foil, a resin film, a resin film with copper foil, a laminate or a printed circuit board; examples of curing accelerator include catalysts such as Lewis base and Lewis acid. The Lewis base includes imidazole, boron trifluoride amine complex, ethyl-triphenyl phosphonium chloride, 2-methylimidazole, 2-phenylimidazole, 2-ethyl-4-methylimidazole, triphenylphosphine, 4-dimethylaminopyridine or any combination thereof. The Lewis acid may comprise metal salt compounds, such as those of manganese, iron, cobalt, nickel, copper and zinc, such as zinc octanoate, cobalt octanoate, zinc acetylacetonate, and cobalt acetylacetonate as a metal catalyst. Alternatively, the curing accelerator may be a peroxide capable of producing free radicals, including but not limited to dicumyl peroxide, tert-butyl peroxybenzoate, 2,5-dimethyl-2,5-di(tert-butylperoxy)-3-hexyne, di(tert-butylperoxyisopropyl)benzene or any combination thereof.

Unless otherwise specified, relative to 100 parts by weight of the maleimide resin and the benzoxazine resin, the flame retardant used in the present disclosure is not particularly limited, and may be used at an amount of 1 to 100 parts by weight. The flame retardant may be any one or more flame retardants useful for preparing a prepreg, a prepreg with copper foil, a resin film, a resin film with copper foil, a laminate or a printed circuit board; examples of flame retardant include but are not limited to halogen-containing flame retardant or phosphorus-containing flame retardant, preferably any one or more selected from the following group: ammonium polyphosphate, hydroquinone bis-(diphenyl phosphate), bisphenol A bis-(diphenylphosphate), tri(2-carboxyethyl) phosphine (TCEP), phosphoric acid tris (chloroisopropyl) ester, trimethyl phosphate (TMP), dimethyl methyl phosphonate (DMMP), resorcinol bis(dixylenyl phosphate) (RDXP, such as commercially available PX-200, PX-201, and PX-202), phosphazene (such as commercially available SPB-100, SPH-100, and SPV-100), melamine polyphosphate, DOPO and its derivatives or resins, DPPO (diphenylphosphine oxide) and its derivatives or resins, melamine cyanurate, tri-hydroxy ethyl isocyanurate and aluminum phosphinate (such as commercially available OP-930 and OP-935).

For example, the flame retardant may be a DPPO compound (e.g., di-DPPO compound), a DOPO compound (e.g., di-DOPO compound), a DOPO resin (e.g., DOPO-HQ, DOPO-NQ, DOPO-PN, and DOPO-BPN), and a DOPO-containing epoxy resin, wherein DOPO-PN is a DOPO phenol novolac compound, and DOPO-BPN may be a bisphenol novolac compound, such as DOPO-BPAN (DOPO-bisphenol A novolac), DOPO-BPFN (DOPO-bisphenol F novolac) and DOPO-BPSN (DOPO-bisphenol S novolac).

Unless otherwise specified, relative to 100 parts by weight of the maleimide resin and the benzoxazine resin, the inorganic filler used in the present disclosure is not particularly limited, and may be used at an amount of 10 to 300 parts by weight. The inorganic filler may be any one or more inorganic fillers useful for preparing a prepreg, a prepreg with copper foil, a resin film, a resin film with copper foil, a laminate or a printed circuit board; examples of inorganic filler include but are not limited to silica (fused, non-fused, porous or hollow type, such as commercially available DL0110), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, mica, boehmite (AlOOH), calcined talc, talc, silicon nitride and calcined kaolin. Moreover, the inorganic filler can be spherical, fibrous, plate-like, particulate, sheet-like or whisker-like and can be optionally pretreated by a silane coupling agent (e.g., a siloxane coupling agent) or a modified coupling agent thereof.

In the present disclosure, the purpose of adding solvent is to change the solid content of the resin composition and to adjust the viscosity of the resin composition; relative to 100 parts by weight of the maleimide resin and the benzoxazine resin, the solvent may be used at an amount of 30 to 300 parts by weight. Unless otherwise specified, the solvent used in the present disclosure is not particularly limited as long as it is suitable for dissolving or diluting the resin composition, examples including but not limited to methanol, ethanol, ethylene glycol monomethyl ether, acetone, butanone (methyl ethyl ketone), methyl isobutyl ketone, cyclohexanone, toluene, xylene, methoxyethyl acetate, ethoxyethyl acetate, propoxyethyl acetate, ethyl acetate, dimethyl formamide, dimethyl acetamide, propylene glycol methyl ether, or a mixture thereof.

Unless otherwise specified, the toughening agent used in the present disclosure is not particularly limited and may be any one or more toughening agents useful for preparing a prepreg, a prepreg with copper foil, a resin film, a resin film with copper foil, a laminate or a printed circuit board, examples including but not limited to rubber resin, carboxyl-terminated butadiene-acrylonitrile (CTBN), CTBN-modified epoxy resin and core-shell rubber.

Unless otherwise specified, the silane coupling agent used in the present disclosure is not particularly limited and may be any one or more silane coupling agents useful for preparing a prepreg, a prepreg with copper foil, a resin film, a resin film with copper foil, a laminate or a printed circuit board, examples including but not limited to silane (e.g., siloxane), which can be further categorized, according to the functional groups, into amino silane, vinyl silane, acrylic silane, and epoxy silane.

Article Made from Resin Composition

The resin composition may be processed by various methods into different articles, such as those suitable for use as components in electronic products, including but not limited to a prepreg, a prepreg with copper foil, a resin film, a resin film with copper foil, a laminate or a printed circuit board.

For example, resin compositions from various embodiments of the present disclosure may be used to make a prepreg, which has an reinforcement material and a layered structure (insulation layer) formed thereon, wherein the layered structure is made by heating the resin composition to a semi-cured state (B-stage) at a temperature for example between 100° C. and 190° C. The reinforcement material may be woven fabric and non-woven fabric, such as fibrous material, including fiberglass fabrics, which can increase the mechanical strength of the prepreg. Types of fiberglass fabrics are not particularly limited and may be any commercial fiberglass fabric useful for various printed circuit boards, such as E-glass fabric, D-glass fabric, S-glass fabric, T-glass fabric, L-glass fabric or NE-glass fabric, wherein the fiber may comprise yarns and rovings, in spread form or standard form. Non-woven fabric preferably comprises non-woven fabric made from liquid crystal polymer, such as polyester non-woven fabric, polyurethane non-woven fabric and so on, but not limited thereto. Woven fabric may also comprise woven fabric made from liquid crystal polymer, such as polyester woven fabric, polyurethane woven fabric and so on, but not limited thereto. Preferably, the reinforcement material can be optionally pre-treated by silane coupling agent.

In one embodiment for making a prepreg with copper foil, the resin composition from each example is loaded into an impregnation tank, and a fiberglass fabric (e.g., 2116 fiberglass fabric, available from Asahi) is passed through the impregnation tank to adhere the resin composition to the fiberglass fabric, followed by heating and baking to the semi-cured state to obtain a prepreg, which is then cut to a proper size and bonded to the copper foil side of the copper foil to form a prepreg with copper foil. The copper foil may be an ordinary copper foil or a carrier-attached ultra-thin copper foil, such as a carrier-attached ultra-thin copper foil of 2 µm or 3 µm in thickness (copper thickness of ultra-thin copper foil is 2 µm or 3 µm and copper thickness of carrier copper foil is 18 µm or 35 µm).

The article made from the resin composition may be a resin film prepared by heating and baking to semi-cure the resin composition. The resin composition may be selectively coated on a polyethylene terephthalate film (PET film), a polyimide film (PI film), a liquid crystal polymer resin film or a resin-coated copper (RCC), followed by heating and baking to semi-cure the resin composition to form the resin film.

In one embodiment for making the resin film with copper foil (e.g., resin-coated copper foil), the resin composition from each example is coated on a copper foil (e.g., an ultra-thin copper foil with a thickness of 2 µm or 3 µm attached with a carrier copper with a thickness of 18 µm or 35 µm), to uniformly adhere the resin composition varnish (thickness of about 30 µm) to the copper foil, followed by heating to a semi-cured state, thereby obtaining the resin film with copper foil.

In another embodiment for making the resin film with copper foil, the resin composition from each example is coated on a PET film or a PI film to uniformly adhere the resin composition (thickness of about 30 µm) on the film, followed by heating and baking to the semi-cured state to obtain the resin film. After that, the resin film is bonded to the copper foil side to form the resin film with copper foil. The copper foil may be an ordinary copper foil or a carrier-attached ultra-thin copper foil, such as a carrier-attached ultra-thin copper foil of 2 µm or 3 µm in thickness (copper thickness of ultra-thin copper foil is 2 µm or 3 µm and copper thickness of carrier copper foil is 18 µm or 35 µm).

Resin compositions of various embodiments of the present disclosure may be made into a laminate, such as a copper-clad laminate, which comprises at least two metal foil layers and an insulation layer (e.g., the aforesaid layered structure) disposed between the metal foils, wherein the insulation layer is made by curing the resin composition at high temperature and high pressure, a suitable curing temperature being for example between 150° C. and 230° C. and preferably between 190° C. and 210° C. The insulation layer may be the aforesaid prepreg or resin film, and the metal foil may be copper, aluminum, nickel, platinum, silver, gold or alloy thereof, such as a copper foil.

The laminate may be further subject to known printed circuit board processes to make a printed circuit board. For example, a double-sided copper-clad laminate (such as product name EM-827, available from Elite Material Co., Ltd.) with a thickness of 28 mil and a 1 ounce (oz) HTE (High Temperature Elongation) copper foil may be provided and subject to hole-drilling and then electroplating, so as to form electrical conduction between the upper layer copper foil and the bottom layer copper foil. Then the upper layer copper foil and the bottom layer copper foil are etched to form inner layer circuits. Then brown oxidation and roughening processes are performed on the inner layer circuits to form uneven structures on the surface to increase roughness. Next, a vacuum lamination apparatus is used to laminate the assembly of a carrier-attached ultra-thin copper foil, the prepreg, the inner layer circuits, the prepreg and a carrier-attached ultra-thin copper foil by heating at 195° C. for 75 minutes to cure the insulation material of the prepregs, followed by removing the carrier of the carrier-attached ultra-thin copper foils. Next, black oxidation, drilling, copper plating and other known circuit board processes are performed on the outmost ultra-thin copper foil so as to obtain the printed circuit board.

The resin composition of the present disclosure and various articles made therefrom have any one or a combination of the following properties:

(1) higher peel strength as measured by reference to IPC-TM-650 2.4.8; for example, if a 1 oz copper foil is used, the peel strength between the copper foil and the insulation material may be greater than or equal to 8.0 lb/in, such as between 8.0 lb/in and 9.0 lb/in; for example, if an ultra-thin copper foil with a thickness of less than or equal to 3 μm is used, the peel strength between the copper foil and the insulation material may be greater than or equal to 5.6 lb/in, such as between 5.6 lb/in and 6.3 lb/in; for example, if an ultra-thin copper foil with a thickness of less than or equal to 2 μm is used, the peel strength between the copper foil and the insulation material may be greater than or equal to 4.5 lb/in, such as between 4.5 lb/in and 5.2 lb/in;

(2) no delamination occurs after subjecting the article to PCT test by reference to IPC-TM-650 2.6.16.1 for 168 hours, such as interlayer delamination between insulation layers is prevented, wherein delamination indicates fail in the test;

(3) higher glass transition temperature (Tg) as measured by reference to IPC-TM-650 2.4.24.4; for example, the glass transition temperature is greater than or equal to 265° C., such as between 265° C. and 335° C.;

(4) lower z-axis ratio of thermal expansion as measured by reference to IPC-TM-650 2.4.24.5; for example, the z-axis ratio of thermal expansion is less than or equal to 1.70%, such as less than or equal to 1.60%, 1.50%, 1.30% or 1.25%;

(5) better T288 thermal resistance as measured by reference to IPC-TM-650 2.4.24.1; for example, the time to delamination is greater than or equal to 10 minutes, such as greater than or equal to 20 minutes, 35 minutes, 50 minutes, 55 minutes, 60 minutes, 120 minutes, 180 minutes, 240 minutes or 300 minutes;

(6) higher flame retardancy, such as in compliance with V0 or V1 rating as specified in the UL94 standard;

(7) lower dielectric constant at 2 GHz as measured by reference to JIS C2565; for example, the dielectric constant is less than or equal to 3.90, such as between 3.75 and 3.90;

(8) lower dissipation factor at 2 GHz as measured by reference to JIS C2565; for example, the dissipation factor is less than or equal to 0.0085, such as between 0.0060 and 0.0085.

The resin composition of the present disclosure and various articles made therefrom preferably have any one or a combination of the following properties:

(1) higher peel strength as measured by reference to IPC-TM-650 2.4.8; for example, if a 1 oz copper foil is used, the peel strength between the copper foil and the insulation material may be greater than or equal to 8.0 lb/in, such as between 8.0 lb/in and 8.6 lb/in; for example, if an ultra-thin copper foil with a thickness of less than or equal to 3 μm is used, the peel strength between the copper foil and the insulation material may be greater than or equal to 5.6 lb/in, such as between 5.6 lb/in and 6.3 lb/in; for example, if an ultra-thin copper foil with a thickness of less than or equal to 2 μm is used, the peel strength between the copper foil and the insulation material may be greater than or equal to 4.5 lb/in, such as between 4.6 lb/in and 5.2 lb/in;

(2) no delamination occurs after subjecting the article to PCT test by reference to IPC-TM-650 2.6.16.1 for 168 hours, such as interlayer delamination between insulation layers is prevented;

(3) higher glass transition temperature (Tg) as measured by reference to IPC-TM-650 2.4.24.4; for example, the glass transition temperature is greater than or equal to 270° C., such as between 270° C. and 330° C.;

(4) lower z-axis ratio of thermal expansion as measured by reference to IPC-TM-650 2.4.24.5; for example, the z-axis ratio of thermal expansion is less than or equal to 1.60%, such as less than or equal to 1.60%, 1.30% or 1.20%;

(5) better T288 thermal resistance as measured by reference to IPC-TM-650 2.4.24.1; for example, the time to delamination is greater than or equal to 50 minutes, such as greater than or equal to 55 minutes, 60 minutes, 120 minutes, 180 minutes, 240 minutes or 300 minutes;

(6) higher flame retardancy, such as in compliance with V0 or V1 rating as specified in the UL94 standard, particularly V0;

(7) lower dielectric constant at 2 GHz as measured by reference to JIS C2565; for example, the dielectric constant is less than or equal to 3.90, such as between 3.75 and 3.90;

(8) lower dissipation factor at 2 GHz as measured by reference to JIS C2565; for example, the dissipation factor is less than or equal to 0.0080, such as between 0.0060 and 0.0080.

The resin composition of the present disclosure and various articles made therefrom more preferably have any one or a combination of the following properties:

(1) higher peel strength as measured by reference to IPC-TM-650 2.4.8; for example, if a 1 oz copper foil is used, the peel strength between the copper foil and the insulation material may be greater than or equal to 8.0 lb/in, such as between 8.0 lb/in and 8.6 lb/in; for example, if an ultra-thin copper foil with a thickness of less than or equal to 3 μm is used, the peel strength between the copper foil and the insulation material may be greater than or equal to 5.6 lb/in, such as between 5.6 lb/in and 6.3 lb/in; for example, if an ultra-thin copper foil with a thickness of less than or equal to 2 μm is used, the peel strength between the copper foil and the insulation material may be greater than or equal to 4.5 lb/in, such as between 4.7 lb/in and 5.2 lb/in;

(2) no delamination occurs after subjecting the article to PCT test by reference to IPC-TM-650 2.6.16.1 for 168 hours, such as interlayer delamination between insulation layers is prevented; (3) higher glass transition temperature (Tg) as measured by reference to IPC-TM-650 2.4.24.4; for example, the glass transition temperature is greater than or equal to 300° C., such as between 300° C. and 330° C.;

(4) lower z-axis ratio of thermal expansion as measured with a TMA instrument by reference to IPC-TM-650 2.4.24.5; for example, the z-axis ratio of thermal expansion is less than or equal to 1.30%, such as less than or equal to 1.10%;

(5) better T288 thermal resistance as measured by reference to IPC-TM-650 2.4.24.1; for example, the time to delamination is greater than or equal to 50 minutes, such as greater than or equal to 55 minutes, 60 minutes, 120 minutes, 180 minutes or 240 minutes;

(6) higher flame retardancy, such as in compliance with V0 or V1 rating as specified in the UL94 standard, particularly V0;

(7) lower dielectric constant at 2 GHz as measured by reference to JIS C2565; for example, the dielectric constant is less than or equal to 3.82, such as between 3.82 and 3.75;

(8) lower dissipation factor at 2 GHz as measured by reference to JIS C2565; for example, the dissipation factor is less than or equal to 0.0072, such as between 0.0060 and 0.0072.

To sum up, various articles made from the resin compositions as disclosed herein have the advantages including high peel strength, high thermal resistance after moisture absorption, high glass transition temperature, low ratio of thermal expansion, long thermal resistance duration, high flame retardancy, low dielectric constant, low dissipation factor, and so on; in particular, it is characterized by high PCT thermal resistance after 168-hour moisture absorption and high peel strength to ultra-thin copper foil, thereby being especially applicable to high speed and high frequency signal transmission circuit boards.

EXAMPLES

Raw materials below were used to prepare the resins compositions of various Examples and Comparative Examples of the present disclosure according to the amount listed in Table 1 to Table 3 and further fabricated to prepare test samples.

Allyl-modified bisphenol A benzoxazine resin (prepared by the Applicant or purchased from Kolon)

Allyl-modified dicyclopentadiene phenol benzoxazine resin (prepared by the Applicant or purchased from Kolon)

Allyl-modified bisphenol F benzoxazine resin (prepared by the Applicant or purchased from Kolon)

BMI-2300: polyphenylmethane maleimide, commercially available from Daiwakasei Industry PNE-177: phenol novolac epoxy resin, commercially available from Chang Chun Plastics NC-3000H: biphenyl epoxy resin, commercially available from Nippon Kayaku PF-3500: oxydianiline benzoxazine resin, commercially available from Chang Chun Plastics LZ8290: bisphenol A benzoxazine resin, commercially available from Huntsman LZ8280: bisphenol F benzoxazine resin, commercially available from Huntsman LZ8270: phenolphthalein benzoxazine resin, commercially available from Huntsman OP-935: aluminum phosphinate, commercially available from Clariant DL0110: fused silica, commercially available from Jinyi Silicon Materials Development Co., Ltd.

2MI: 2-methylimidazole, commercially available from Shikoku Chemicals Corp.

MEK: methyl ethyl ketone

DMAC: dimethylacetamide

TABLE 1

Resin compositions of Examples (in part by weight) and test results

| | component | | E1 | E2 | E3 | E4 | E5 | E6 | E7 | E8 |
|---|---|---|---|---|---|---|---|---|---|---|
| maleimide resin | polyphenyl-methane maleimide | BMI-2300 | 50 | 80 | 40 | 50 | 50 | 50 | 50 | 50 |
| benzo-xazine resin | oxydianiline benzoxazine resin | PF-3500 | 30 | 30 | 30 | 10 | 27 | 12 | 40 | 30 |
| | unsaturated bond-containing benzoxazine resin | allyl-modified dicyclo-pentadiene phenol benzoxazine resin allyl-modified bisphenol A benzoxazine resin allyl-modified bisphenol F benzoxazine resin | 10 | 10 | 10 | 20 | 3 | 3 | 10 | 10 |
| | bisphenol A benzoxazine resin | LZ8290 | | | | | | | | |
| | bisphenol F benzoxazine resin | LZ8280 | | | | | | | | |
| | phenolphthalein benzoxazine resin | LZ8270 | | | | | | | | |
| epoxy resin | biphenyl epoxy resin | NC-3000H | 20 | 20 | 20 | 20 | 20 | 20 | 20 | 10 |
| | phenol novolac epoxy resin | PNE-177 | | | | | | | | |

TABLE 1-continued

Resin compositions of Examples (in part by weight) and test results

| | | | | | | | | | | |
|---|---|---|---|---|---|---|---|---|---|---|
| flame retardant | aluminum phosphinate | OP-935 | 10 | 10 | 10 | 10 | 10 | 10 | 10 | 10 |
| inorganic filler | fused silica | DL0110 | 100 | 100 | 100 | 100 | 100 | 100 | 100 | 100 |
| solvent | methyl ethyl ketone | MEK | 30 | 30 | 30 | 30 | 30 | 30 | 30 | 30 |
| | dimethyl-acetamide | DMAC | 30 | 30 | 30 | 30 | 30 | 30 | 30 | 30 |
| curing accelerator | 2-methyl-imidazole | 2MI | 0.1 | 0.1 | 0.1 | 0.1 | 0.1 | 0.1 | 0.1 | 0.1 |

| property test | test item (method) | unit | E1 | E2 | E3 | E4 | E5 | E6 | E7 | E8 |
|---|---|---|---|---|---|---|---|---|---|---|
| glass transition temperature (Tg) | DMA | ° C. | 325 | 330 | 305 | 315 | 318 | 305 | 328 | 327 |
| CTE (50 to 260° C.) | TMA (z-axis) | % | 1.10 | 1.10 | 1.20 | 1.20 | 1.15 | 1.20 | 1.25 | 1.10 |
| peel strength | 1 oz HTE copper foil | lb/in | 8.5 | 8.5 | 8.2 | 8.1 | 8.5 | 8.0 | 8.6 | 8.3 |
| | ultra-thin copper foil (2 μm) | lb/in | 5.2 | 4.9 | 5.1 | 5.2 | 4.9 | 4.7 | 5.2 | 5.0 |
| | ultra-thin copper foil (3 μm) | lb/in | 6.2 | 5.8 | 6.0 | 6.2 | 5.9 | 5.6 | 6.3 | 6.0 |
| T288 (copper-containing) | TMA | minute | >60 | >60 | 55 | >60 | >60 | >60 | 50 | >60 |
| PCT test | 3 hours | NA | pass | pass | pass | pass | pass | pass | pass | pass |
| | 168 hours | NA | pass | pass | pass | pass | pass | pass | pass | pass |
| dielectric constant (RC 70%) | dielectric constant at 2 GHz | NA | 3.80 | 3.75 | 3.82 | 3.75 | 3.81 | 3.78 | 3.82 | 3.80 |
| dissipation factor (RC 70%) | dissipation factor at 2 GHz | NA | 0.0065 | 0.0060 | 0.0070 | 0.0060 | 0.0066 | 0.0065 | 0.0072 | 0.0065 |
| flame retardancy test | UL94 | NA | V-0 | V-0 | V-0 | V-0 | V-0 | V-0 | V-0 | V-0 |

TABLE 2

Resin compositions of Examples (in part by weight) and test results

| | component | | E9 | E10 | E11 | E12 | E13 | E14 | E15 | E16 | E17 |
|---|---|---|---|---|---|---|---|---|---|---|---|
| maleimide resin | polyphenyl-methane maleimide | BMI-2300 | 50 | 50 | 50 | 50 | 30 | 90 | 50 | 50 | 50 |
| benzoxazine resin | oxydianiline benzoxazine resin | PF-3500 | 30 | 30 | 30 | 30 | 30 | 30 | 48 | 30 | 30 |
| | unsaturated bond-containing benzoxazine resin | allyl-modified dicyclo-pentadiene phenol benzoxazine resin | 10 | 10 | 10 | 4 | 10 | 10 | 12 | 10 | 10 |
| | | allyl-modified bisphenol A benzoxazine resin | | | | 3 | | | | | |
| | | allyl-modified bisphenol F benzoxazine resin | | | | 3 | | | | | |

TABLE 2-continued

Resin compositions of Examples (in part by weight) and test results

| | | | | | | | | | | |
|---|---|---|---|---|---|---|---|---|---|---|
| | bisphenol A benzoxazine resin | LZ8290 | | | | | | | | |
| | bisphenol F benzoxazine resin | LZ8280 | | | | | | | | |
| | phenol-phthalein benzoxazine resin | LZ8270 | | | | | | | | |
| epoxy resin | biphenyl epoxy resin | NC-3000H | 50 | 15 | | 20 | 20 | 20 | 20 | 65 |
| | phenol novolac epoxy resin | PNE-177 | | 15 | 20 | | | | | |
| flame retardant | aluminum phosphinate | OP-935 | 10 | 10 | 10 | 10 | 10 | 10 | 10 | 10 |
| inorganic filler | fused silica | DL0110 | 100 | 100 | 100 | 100 | 100 | 100 | 100 | 100 |
| solvent | methyl ethyl ketone | MEK | 30 | 30 | 30 | 30 | 30 | 30 | 30 | 30 |
| | dimethyl-acetamide | DMAC | 30 | 30 | 30 | 30 | 30 | 30 | 30 | 30 |
| curing accelerator | 2-methyl-imidazole | 2MI | 0.1 | 0.1 | 0.1 | 0.1 | 0.1 | 0.1 | 0.1 | 0.1 |

| property test | test item (method) | unit | E9 | E10 | E11 | E12 | E13 | E14 | E15 | E16 | E17 |
|---|---|---|---|---|---|---|---|---|---|---|---|
| glass transition temperature (Tg) | DMA | °C. | 300 | 320 | 320 | 320 | 270 | 335 | 330 | 328 | 265 |
| CTE (5 to 260° C.) | TMA (z-axis) | % | 1.30 | 1.12 | 1.12 | 1.11 | 1.60 | 1.10 | 1.50 | 1.10 | 1.70 |
| peel strength | 1 oz HTE copper foil | lb/in | 8.6 | 8.5 | 8.5 | 8.3 | 8.0 | 8.0 | 8.5 | 8.0 | 8.3 |
| | ultra-thin copper foil (2 μm) | lb/in | 5.2 | 5.1 | 4.9 | 5.1 | 4.7 | 4.6 | 4.9 | 4.8 | 5.0 |
| | ultra-thin copper foil (3 μm) | lb/in | 6.3 | 6.2 | 6.0 | 6.1 | 5.8 | 5.8 | 6.0 | 5.8 | 6.0 |
| T288 (copper-containing) | TMA | minute | >60 | >60 | >60 | >60 | 20 | 35 | 10 | 10 | 20 |
| PCT test | 3 hours | NA | pass | pass | pass | pass | pass | pass | pass | pass | pass |
| | 168 hours | NA | pass | pass | pass | pass | pass | pass | pass | pass | pass |
| dielectric constant (RC 70%) | dielectric constant at 2 GHz | NA | 3.80 | 3.80 | 3.80 | 3.80 | 3.85 | 3.80 | 3.90 | 3.80 | 3.80 |
| dissipation factor (RC 70%) | dissipation factor at 2 GHz | NA | 0.0071 | 0.0066 | 0.0067 | 0.0064 | 0.0080 | 0.0065 | 0.0080 | 0.0066 | 0.0085 |
| flame retardancy test | UL94 | NA | V-0 | V-0 | V-0 | V-0 | V-1 | V-0 | V-0 | V-0 | V-1 |

TABLE 3

Resin compositions of Comparative Examples (in part by weight) and test results

| | component | | C1 | C2 | C3 | C4 | C5 | C6 | C7 | C8 |
|---|---|---|---|---|---|---|---|---|---|---|---|
| maleimide resin | polyphenylmethane maleimide | BMI-2300 | 50 | 50 | 50 | 50 | 50 | 50 | 50 | 50 |
| benzoxazine resin | oxydianiline benzoxazine resin | PF-3500 | 30 | 30 | 8 | 40 | | | | |
| | unsaturated bond-containing benzoxazine resin | allyl-modified dicyclopentadiene phenol benzoxazine resin | | | 2 | | 40 | | | |

TABLE 3-continued

Resin compositions of Comparative Examples (in part by weight) and test results

|  |  |  | | | | | | | | |
|---|---|---|---|---|---|---|---|---|---|---|
|  | bisphenol A benzoxazine resin | LZ8290 | 10 | | | | | | 40 | |
|  | bisphenol F benzoxazine resin | LZ8280 | | 10 | | | | | | 40 | |
|  | phenolphthalein benzoxazine resin | LZ8270 | | | | | | | | | 40 |
| epoxy resin | biphenyl epoxy resin | NC-3000H | 20 | 20 | 20 | 20 | 20 | 20 | 20 | 20 |
|  | phenol novolac epoxy resin | PNE-177 | | | | | | | | |
| flame retardant | aluminum phosphinate | OP-935 | 10 | 10 | 10 | 10 | 10 | 10 | 10 | 10 |
| inorganic filler | fused silica | DL0110 | 100 | 100 | 100 | 100 | 100 | 100 | 100 | 100 |
| solvent | methyl ethyl ketone | MEK | 30 | 30 | 30 | 30 | 30 | 30 | 30 | 30 |
|  | dimethylacetamide | DMAC | 30 | 30 | 30 | 30 | 30 | 30 | 30 | 30 |
| curing accelerator | 2-methylimidazole | 2MI | 0.1 | 0.1 | 0.1 | 0.1 | 0.1 | 0.1 | 0.1 | 0.1 |

| property test | test item (method) | unit | C1 | C2 | C3 | C4 | C5 | C6 | C7 | C8 |
|---|---|---|---|---|---|---|---|---|---|---|
| glass transition temperature (Tg) | DMA | °C. | 318 | 319 | 300 | 320 | 325 | 320 | 322 | 335 |
| CTE (50 to 260° C.) | TMA (z-axis) | % | 1.20 | 1.20 | 1.20 | 1.20 | 1.20 | 1.20 | 1.20 | 1.15 |
| peel strength | 1 oz HTE copper foil | lb/in | 8.0 | 8.0 | 7.5 | 8.6 | 7.2 | 7.0 | 6.9 | 7.2 |
|  | ultra-thin copper foil (2 μm) | lb/in | 4.1 | 4.2 | 3.4 | 3.8 | 4.0 | 3.5 | 3.3 | 3.5 |
|  | ultra-thin copper foil (3 μm) | lb/in | 5.2 | 5.3 | 4.3 | 4.9 | 4.8 | 4.4 | 4.3 | 4.6 |
| T288 (copper-containing) | TMA | minute | 38 | 38 | 50 | >60 | 10 | 30 | 30 | 40 |
| PCT test | 3 hours | NA | pass | pass | pass | pass | pass | pass | pass | pass |
|  | 168 hours | NA | fail | fail | fail | pass | fail | fail | fail | fail |
| dielectric constant (RC 70%) | dielectric constant at 2 GHz | NA | 3.85 | 3.80 | 3.80 | 3.81 | 3.78 | 3.80 | 3.80 | 3.85 |
| dissipation factor (RC 70%) | dissipation factor at 2 GHz | NA | 0.0065 | 0.0065 | 0.0070 | 0.0066 | 0.0065 | 0.0066 | 0.0065 | 0.0069 |
| flame retardancy test | UL94 | NA | V-0 | V-0 | V-0 | V-0 | V-0 | V-0 | V-0 | V-0 |

Preparation of Varnish

According to the amount listed in Table 1 to Table 3, place the resin composition from each Example (abbreviated as E1, E2, etc.) or Comparative Example (abbreviated as C1, C2, etc.) into a stirrer for stirring and well-mixing to form a resin varnish. Amount of each component of the resin compositions in each table, except for solvent, represents the part by weight of the solid substance, and the amount of solvent represents the part by weight of liquid substance.

Methods for preparing various products or samples from the resin compositions according to the present disclosure are illustrated below.

Preparation of Prepregs

Resin composition from each Example or Comparative Example was loaded into an impregnation tank for impregnating fiberglass fabric (e.g., 2116 E-glass fiber fabric, 106 E-glass fiber fabric or 7628 E-glass fiber fabric, all commercially available from Asahi), such that the resin composition was adhered on the fiberglass fabric, followed by heating at 182° C. for about 3 minutes to obtain a prepreg.

For the property tests listed in Table 1 to Table 3, samples (specimens) were prepared as described below and tested under specified conditions below.

1. Copper-Containing Laminate (Obtained by Laminating Five Prepregs)

Two pieces of 0.5 ounce (oz) (thickness of 18 μm) HTE (High Temperature Elongation) copper foil and five pieces of prepreg (2116 E-glass fabric) obtained from each sample were prepared, wherein each prepreg has a resin content of about 55%. A copper foil, five prepregs and a copper foil were superimposed in such order and then subject to a vacuum condition for lamination at 195° C. for 2 hours to form each copper-clad laminate sample. In the sample, five superimposed prepregs were cured to form the insulation material layer between the two copper foils, wherein the insulation material layer has a resin content of about 55%.

2. Copper-Free Laminate (Obtained by Laminating Five Prepregs)

Each copper-containing laminate was etched to remove the two copper foils to obtain a copper-free laminate obtained by laminating five prepregs and having a resin content of about 55%.

3. Copper-Free Laminate (Obtained by Laminating Two Prepregs)

Two pieces of 0.5 ounce HTE copper foil and two pieces of prepreg (106 E-glass fabric) obtained from each sample were prepared, wherein each prepreg has a resin content of about 70%. A copper foil, two prepregs and a copper foil were superimposed in such order and then subject to a vacuum condition for lamination at 195° C. for 2 hours to form each copper-clad laminate sample. Next, each copper-containing laminate was etched to remove the two copper foils to obtain a copper-free laminate obtained by laminating two prepregs and having a resin content of about 70%.

4. Copper-Free Laminate (Obtained by Laminating Eight Prepregs)

Two pieces of 0.5 ounce HTE copper foil and eight pieces of prepreg (7628 E-glass fabric) obtained from each sample were prepared, wherein each prepreg has a resin content of about 45%. A copper foil, eight prepregs and a copper foil were superimposed in such order and then subject to a vacuum condition for lamination at 195° C. for 2 hours to form each copper-containing laminate sample. Next, each copper-containing laminate was etched to remove the two copper foils to obtain a copper-free laminate obtained by laminating eight prepregs and having a resin content of about 45%.

5. Circuit Board (Four-Layer)

A core was prepared as follows: preparing four first prepregs (e.g., EM-827 available from Elite Material Co., Ltd., using 7628 E-glass fabric, RC=42%); at two sides of the four superimposed prepregs, covering a copper foil, followed by lamination and curing for 2 hours in vacuum at high temperature (195° C.) and high pressure (360 psi) to obtain a copper-containing core. Then the core was subject to a brown oxidation process to obtain a brown oxide treated core. Next, two sides on the outer layers of the brown oxide treated core were respectively covered with a prepreg from each Example or Comparative Example and a piece of 2 μm carrier-attached ultra-thin copper foil, followed by lamination for 2 hours in vacuum at 195° C. to obtain a laminate containing an ultra-thin copper foil. Carrier copper foil on the ultra-thin copper surface of the laminate was peeled off and electroplating of the whole plate was performed without cleaning, such that the copper layer has a thickness of 35 μm to form a four-layer circuit board. According to the test need, the 2 μm carrier-attached ultra-thin copper foil may be replaced by a 3 μm carrier-attached ultra-thin copper foil.

Each specimen was analyzed as described below.

1. Glass Transition Temperature (Tg)

The copper-free laminate (obtained by laminating five prepregs) specimen was subject to glass transition temperature measurement. A dynamic mechanical analyzer (DMA) was used by reference to IPC-TM-650 2.4.24.4 "Glass Transition and Modulus of Materials Used in High Density Interconnection (HDI) and Microvias-DMA Method" to measure each specimen.

2. Thermal Expansion (Dimensional Change, z-Axis, Total Expansion)

The copper-free laminate (obtained by laminating five prepregs) specimen was subject to thermal mechanical analysis (TMA) during thermal expansion measurement. Each sample was heated from 50° C. to 260° C. at an increase rate of 10° C./minute and then subject to the measurement of dimensional change ratio (%) by reference to the method described in IPC-TM-650 2.4.24.5, wherein lower dimensional change ratio (%) is more preferred and a value of greater than or equal to 0.01% represents significant difference.

3. Thermal Resistance (T288)

The copper-containing laminate (obtained by laminating five prepregs) specimen was subject to T288 thermal resistance test for delamination. At a constant temperature 288° C., a thermomechanical analyzer (TMA) was used by reference to IPC-TM-650 2.4.24.1 "Time to Delamination (TMA Method)" to measure each specimen and record the time to delamination.

4. Dielectric Constant (Dk) and Dissipation Factor (Df)

In dielectric constant and dissipation factor measurements, the copper-free laminate (obtained by laminating two prepregs) was tested by using a microwave dielectrometer available from AET Corp. by reference to JIS C2565 "Measuring methods for ferrite cores for microwave device" at 2 GHz for analyzing each specimen. Lower dielectric constant and lower dissipation factor represent better dielectric properties of the specimen. A difference in Dk of greater than 0.05 represents a significant difference in dielectric constant in different laminates. A difference in Df of greater than 0.0005 represents a significant difference in dissipation factor in different laminates.

5. Ordinary Copper Foil Peel Strength (P/S)

The copper-containing laminate (obtained by laminating five prepregs) was replaced by the copper-clad laminate containing 1 oz HTE copper foil, and the peel strength (lb/in) of the laminate to the copper foil was measured by reference to IPC-TM-650 2.4.8 "Peel Strength of Metallic Clad Laminates".

6. Ultra-Thin Copper Foil Peel Strength (P/S)

The circuit board (four-layer) was used as the specimen for the measurement of the peel strength (lb/in) of the laminate to the 2 μm or 3 μm ultra-thin copper foil by reference to IPC-TM-650 2.4.8 "Peel Strength of Metallic Clad Laminates".

7. Thermal Resistance after Moisture Absorption (121° C./100% Relative Humidity/168 Hours)

The copper-free laminate specimen (obtained by laminating five prepregs) was subject to pressure cooking test (PCT) by reference to IPC-TM-650 2.6.16.1, before which the specimen was placed in an environment for moisture absorption for 3 hours (relative humidity 100%) or 168 hours (relative humidity 100%), followed by inspecting the existence of delamination, which represents fail, such as whether interlayer delamination (i.e., blistering and separation between any layers) occurs between insulation layers.

8. Flame Retardancy

In the flame retardancy test, a 125 mm×13 mm copper-free laminate specimen (obtained by laminating eight prepregs) was measured in accordance with the UL94 standard to evaluate flame retardancy rating represented by V-0, V-1, or V-2, wherein V-0 indicates a superior flame retardancy to V-1, V-1 indicates a superior flame retardancy to V-2, and burn-out is the worst.

Based on the test results from Table 1 to Table 3, it is apparent that by using the solution according to the present disclosure (E1 to E17), at least one laminate property is superior to other solutions. Even more unexpectedly, the resin composition of this disclosure can achieve, in addition to higher peel strength between ultra-thin copper foil and insulation material, excellent PCT thermal resistance after 168-hour moisture absorption.

Specifically, various Examples and embodiments of the present disclosure achieve at the same time high peel strength (e.g., a peel strength of ordinary copper foil of greater than or equal to 8.0 lb/in, preferably greater than or equal to 8.2 lb/in, a peel strength of 3 μm ultra-thin copper foil of greater than or equal to 5.6 lb/in, and a peel strength of 2 μm ultra-thin copper foil of greater than or equal to 4.5 lb/in, preferably greater than or equal to 4.7 lb/in), high glass transition temperature (e.g., greater than or equal to 300° C.), low thermal expansion (e.g., less than or equal to 1.30%), high thermal resistance after moisture absorption (no delamination up to 168 hours), high thermal resistance (e.g., T288 of greater than or equal to 50 minutes without delamination), low dielectric constant (e.g., less than or equal to 3.90, preferably less than or equal to 3.82), low dissipation factor (e.g., less than or equal to 0.0072) and high flame retardancy (e.g., V-0 or V-1). In contrast, Comparative Examples fail to meet one or more preferred properties described above.

For example, comparisons between E1 to E17 with C1 to C8 show that when the resin composition comprises 15 parts by weight to 60 parts by weight of a benzoxazine resin and the weight ratio of oxydianiline benzoxazine resin to unsaturated bond-containing benzoxazine resin is between 1:2 and 9:1, unexpected excellent properties such as ultra-thin copper foil peel strength and PCT thermal resistance after 168-hour moisture absorption.

The above detailed description is merely illustrative in nature and is not intended to limit the embodiments of the subject matter or the application and uses of such embodiments. As used herein, the term "exemplary" means "serving as an example, instance, or illustration." Any implementation described herein as exemplary is not necessarily to be construed as preferred or advantageous over other implementations.

Moreover, while at least one exemplary example or comparative example has been presented in the foregoing detailed description, it should be appreciated that a vast number of variations exist. It should also be appreciated that the exemplary one or more embodiments described herein are not intended to limit the scope, applicability, or configuration of the claimed subject matter in any way. Rather, the foregoing detailed description will provide those skilled in the art with a convenient guide for implementing the described one or more embodiments. Also, the scope defined by the claims includes known equivalents and foreseeable equivalents at the time of filing this patent application.

What is claimed is:

1. A resin composition, comprising 30 parts by weight to 90 parts by weight of a maleimide resin and 15 parts by weight to 60 parts by weight of a benzoxazine resin, wherein the benzoxazine resin comprises an oxydianiline benzoxazine resin and an unsaturated bond-containing benzoxazine resin, and a weight ratio of the oxydianiline benzoxazine resin to the unsaturated bond-containing benzoxazine resin is between 1:2 and 9:1, and wherein the unsaturated bond-containing benzoxazine resin comprises an allyl-modified dicyclopentadiene phenol benzoxazine resin.

2. The resin composition of claim 1, wherein the weight ratio of the oxydianiline benzoxazine resin to the unsaturated bond-containing benzoxazine resin is 1:1, 2:1, 3:1, 4:1, 5:1, 6:1, 7:1 or 8:1.

3. The resin composition of claim 1, further comprising epoxy resin.

4. The resin composition of claim 3, wherein a content of the maleimide resin is greater than or equal to a content of the epoxy resin.

5. The resin composition of claim 3, comprising 30 parts by weight to 90 parts by weight of the maleimide resin and 10 parts by weight to 65 parts by weight of the epoxy resin.

6. The resin composition of claim 1, further comprising one or more of the following additives: polyphenylene oxide resin, cyanate ester resin, isocyanate resin, polyolefin resin, anhydride, polyester, phenolic curing agent, amine curing agent, polyamide and polyimide.

7. The resin composition of claim 1, further comprising curing accelerator, flame retardant, inorganic filler, solvent, toughening agent, silane coupling agent or a combination thereof.

8. The resin composition of claim 1, wherein the allyl-modified dicyclopentadiene phenol benzoxazine resin has the following structure:

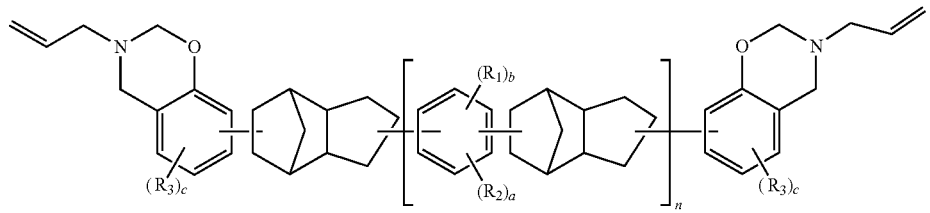

wherein a and b independently represent an integer of 0 to 4 and a+b≤4; c represents an integer of 0 to 2; $R_1$ and $R_2$ independently represent hydrogen, oxygen-containing group or substituted or unsubstituted alkyl, or $R_1$ and $R_2$ together form an N-heterocycle or O-heterocycle; $R_3$ represents hydrogen or substituted or unsubstituted alkyl; and n is an integer of 1 to 10.

9. A resin composition, comprising 10 parts by weight to 65 parts by weight of epoxy resin, 30 parts by weight to 90 parts by weight of a maleimide resin and 15 parts by weight to 60 parts by weight of a benzoxazine resin, wherein:
the benzoxazine resin comprises an oxydianiline benzoxazine resin and an unsaturated bond-containing benzoxazine resin, and a weight ratio of the oxydianiline benzoxazine resin to the unsaturated bond-containing benzoxazine resin is between 1:2 and 9:1, and wherein the unsaturated bond-containing benzoxazine resin comprises an allyl-modified dicyclopentadiene phenol benzoxazine resin; and
a weight ratio of the maleimide resin to the epoxy resin is between 5:1 and 1:1.

10. An article made from the resin composition of claim 1, comprising a prepreg, a prepreg with copper foil, a resin film, a resin film with copper foil, a laminate or a printed circuit board.

11. The article of claim 10, which comprises a copper foil and an insulation layer, wherein a peel strength of the article as measured by reference to IPC-TM-650 2.4.8 is between 4.0 lb/in and 9.0 lb/in.

12. The article of claim 10, which comprises a copper foil and an insulation layer, wherein the copper foil has a thickness of between 1 μm and 6 μm, and the article has a peel strength as measured by reference to IPC-TM-650 2.4.8 of between 4.5 lb/in and 6.5 lb/in.

13. The article of claim 10, wherein interlayer delamination is prevented after subjecting the article to PCT test by reference to IPC-TM-650 2.6.16.1 for 168 hours.

14. The article of claim 10, having at least one of the following properties:
- a glass transition temperature as measured by reference to IPC-TM-650 2.4.24.4 of greater than or equal to 300° C.;
- a z-axis ratio of thermal expansion measured with a TMA instrument by reference to IPC-TM-650 2.4.24.5 of less than or equal to 1.3%; and
- a T288 thermal resistance as measured by reference to IPC-TM-650 2.4.24.1 of greater than or equal to 50 minutes.

15. The article of claim 10, having at least one of the following properties:
- a dielectric constant at 2 GHz as measured by reference to JIS C2565 of less than or equal to 3.90; and
- a dissipation factor at 2 GHz as measured by reference to JIS C2565 of less than or equal to 0.0072.

* * * * *